(12) United States Patent
Tanaka et al.

(10) Patent No.: US 10,157,762 B2
(45) Date of Patent: Dec. 18, 2018

(54) SUBSTRATE PROCESSING APPARATUS AND SUBSTRATE PRESENCE OR ABSENCE CHECKING METHOD AND PROGRAM

(71) Applicant: EBARA CORPORATION, Tokyo (JP)

(72) Inventors: Tomohiro Tanaka, Tokyo (JP); Kenichiro Saito, Tokyo (JP); Koichi Takeda, Tokyo (JP); Masumi Nishijima, Tokyo (JP); Ryuichi Kosuge, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 126 days.

(21) Appl. No.: 15/475,860

(22) Filed: Mar. 31, 2017

(65) Prior Publication Data
US 2017/0287755 A1 Oct. 5, 2017

(30) Foreign Application Priority Data
Apr. 4, 2016 (JP) .................................. 2016-074951

(51) Int. Cl.
*H01L 21/67* (2006.01)
*H01L 21/687* (2006.01)

(52) U.S. Cl.
CPC .. *H01L 21/67259* (2013.01); *H01L 21/67265* (2013.01); *H01L 21/68735* (2013.01); *H01L 21/68785* (2013.01)

(58) Field of Classification Search
CPC .................... H01L 21/67265; H01L 21/67259
See application file for complete search history.

(56) References Cited

U.S. PATENT DOCUMENTS

| | | | | |
|---|---|---|---|---|
| 6,090,158 A | * | 7/2000 | McLaughlin | D06C 23/02 223/1 |
| 2005/0036873 A1 | * | 2/2005 | Ikehata | B65G 49/063 414/676 |
| 2009/0120362 A1 | * | 5/2009 | Hamada | H01L 21/67051 118/686 |
| 2010/0245792 A1 | * | 9/2010 | Bijnen | G03B 27/42 355/53 |
| 2010/0309484 A1 | * | 12/2010 | Yagi | B65G 49/064 356/614 |
| 2015/0179491 A1 | * | 6/2015 | Katsuda | B25J 9/1694 700/213 |
| 2015/0370246 A1 | * | 12/2015 | Yuk | H01L 21/67259 700/112 |

(Continued)

FOREIGN PATENT DOCUMENTS

JP 2010-050436 A 3/2010

*Primary Examiner* — Thomas Randazzo
(74) *Attorney, Agent, or Firm* — Pearne & Gordon LLP

(57) ABSTRACT

A substrate processing apparatus includes transport mechanisms 121a to 127a, a sensor 40 for detecting whether a wafer W is held by the transport mechanisms 121a to 127a, a sensor controller 82 for controlling the sensor 40, a position information acquiring part 81 for acquiring position information of the substrate W in the transport passage, a detection result acquiring part 83 for acquiring a detection result from the sensor 40, and a determination processor 84 for determining whether the detection result of the sensor and the position information are consistent with each other. When it is determined that the detection result of the sensor 40 is inconsistent with the position information, the sensor controller 82 makes the sensor 40 retry to detect whether the substrate W is held.

6 Claims, 8 Drawing Sheets

(56) References Cited

U.S. PATENT DOCUMENTS

| | | | |
|---|---|---|---|
| 2016/0020125 A1* | 1/2016 | Kuwahara | H01L 21/67028 414/222.02 |
| 2016/0048087 A1* | 2/2016 | Yang | G03F 7/70708 355/72 |
| 2017/0259584 A1* | 9/2017 | Higuchi | B41M 5/382 |
| 2017/0263483 A1* | 9/2017 | Kuwahara | H01L 21/67259 |
| 2018/0029237 A1* | 2/2018 | Sugawara | B25J 13/08 |

* cited by examiner

SUBSTRATE PROCESSING APPARATUS AND SUBSTRATE PRESENCE OR ABSENCE CHECKING METHOD AND PROGRAM

CROSS-REFERENCE TO RELATED APPLICATIONS

This application claims the benefit of Japanese Priority Patent Application JP 2016-074951 filed on Apr. 4, 2016, the entire contents of which are incorporated herein by reference.

FIELD

The present invention relates to a substrate processing apparatus, and particularly to a technique of checking the presence or absence of a substrate in a substrate transport passage.

BACKGROUND AND SUMMARY

As semiconductor devices have become highly integrated, the wiring of circuits has become finer and the inter-wiring distance is also becoming smaller. In a manufacturing field of semiconductor devices, many kinds of materials in the form of films are repetitively formed on a silicon wafer to form a laminated structure. A technique for planarizing the surfaces of wafers has been an important technique to form such a laminated structure, and a polishing apparatus for performing chemical mechanical polishing (CMP) (which is also called as a chemical mechanical polishing apparatus) has been widely used as one means for planarizing the surfaces of wafers as described above.

A conventional CMP apparatus is provided with a linear transporter for transporting a substrate such as a semiconductor wafer along a predetermined transport passage, and a transmission type sensor for detecting the presence or absence of a wafer is provided to each transport stage of the linear transporter. The conventional CMP apparatus is capable of detecting the presence or absence of the wafer on each transport stage by using this sensor.

It is conceivable for the conventional CMP apparatus that the presence or absence of a wafer in the transport passage is checked by using position information of the wafer in the transport passage (information representing a transport stage on which the wafer must be located). For example, when position information of a wafer in the transport passage is inconsistent with a detection result of the sensor, that is, when the detection result of the sensor indicates the absence of a wafer, whereas the sensor should determine the presence of a wafer according to wafer position information, or when the detection result of the sensor indicates "the presence of a wafer", whereas the sensor should determine the absence of a wafer according to wafer position information, it is conceivable that an alarm is raised to emergently stop the transportation of the wafer.

In some circumstances, the CMP apparatus is provided with a shower nozzle for spraying water (pure water) to a wafer so as to prevent drying of the wafer while the wafer is transported along the transport passage. Furthermore, in some circumstances, water (pure water) is used to wash wafers after polishing. A transmission type sensor (for example, an optical sensor) has a risk of chattering that may be induced in light amount by an effect of such water or sneaking of light, so that misdetection caused by the chattering occurs. For example, the absence of a wafer may be misdetected due to the effect of chattering although a wafer is present, or the presence of a wafer may be misdetected due to the effect of chattering although a wafer is absent.

When such misdetection caused by chattering occurs in the sensor, a determination result as to whether the position information of a wafer in the transport passage and the detection result of the sensor are consistent with each other provides an erroneous determination, so that an alarm is erroneously raised. When the transport of wafers is emergently stopped every time an alarm is erroneously raised as described above, the productivity and through-put of CMP apparatuses are lowered. Therefore, it has been desired to develop a technique capable of reducing the influence of misdetection of a sensor caused by chattering to suppress reduction of the through-put.

An object of the present technique, which has been implemented in view of the foregoing problem, is to provide a substrate processing apparatus capable of reducing the influence of misdetection of a sensor caused by chattering and suppressing reduction of the through-put.

A substrate processing apparatus according to the present technique comprises a transport mechanism that transports a substrate along a predetermined transport passage while holding the substrate, a sensor that detects whether the substrate is held by the transport mechanism, a sensor controller that controls the sensor, a position information acquiring part that acquires position information of the substrate in the transport passage, a detection result acquiring part that acquires a detection result from the sensor, and a determination processor that determines whether the detection result of the sensor is consistent with the position information, wherein when it is determined that the detection result of the sensor is inconsistent with the position information, the sensor controller makes the sensor retry to detect whether the substrate is held.

A substrate presence or absence checking method according to the present technique is a substrate presence or absence checking method to be executed by a substrate processing apparatus including a transport mechanism for transporting a substrate along a predetermined transport passage while holding the substrate, and a sensor for detecting whether the substrate is held by the transport mechanism, and the substrate presence or absence checking method comprises a step for acquiring position information of the substrate in the transport passage; a step for acquiring a detection result from the sensor, a step for determining whether the detection result of the sensor is consistent with the position information, and a step for making the sensor retry to detect whether the substrate is held when it is determined that the detection result of the sensor is inconsistent with the position information.

A program according to the present technique is a program to be executed by a substrate processing apparatus including a transport mechanism for transporting a substrate along a predetermined transport passage while holding the substrate, and a sensor for detecting whether the substrate is held by the transport mechanism, and makes the substrate processing apparatus execute processing of acquiring position information of the substrate in the transport passage, processing of acquiring a detection result from the sensor, processing of determining whether the detection result of the sensor is consistent with the position information, and processing of making the sensor retry to detect whether the substrate is held when it is determined that the detection result of the sensor is inconsistent with the position information.

DETAILED DESCRIPTION OF NON-LIMITING EXAMPLE EMBODIMENTS

Figure 1:
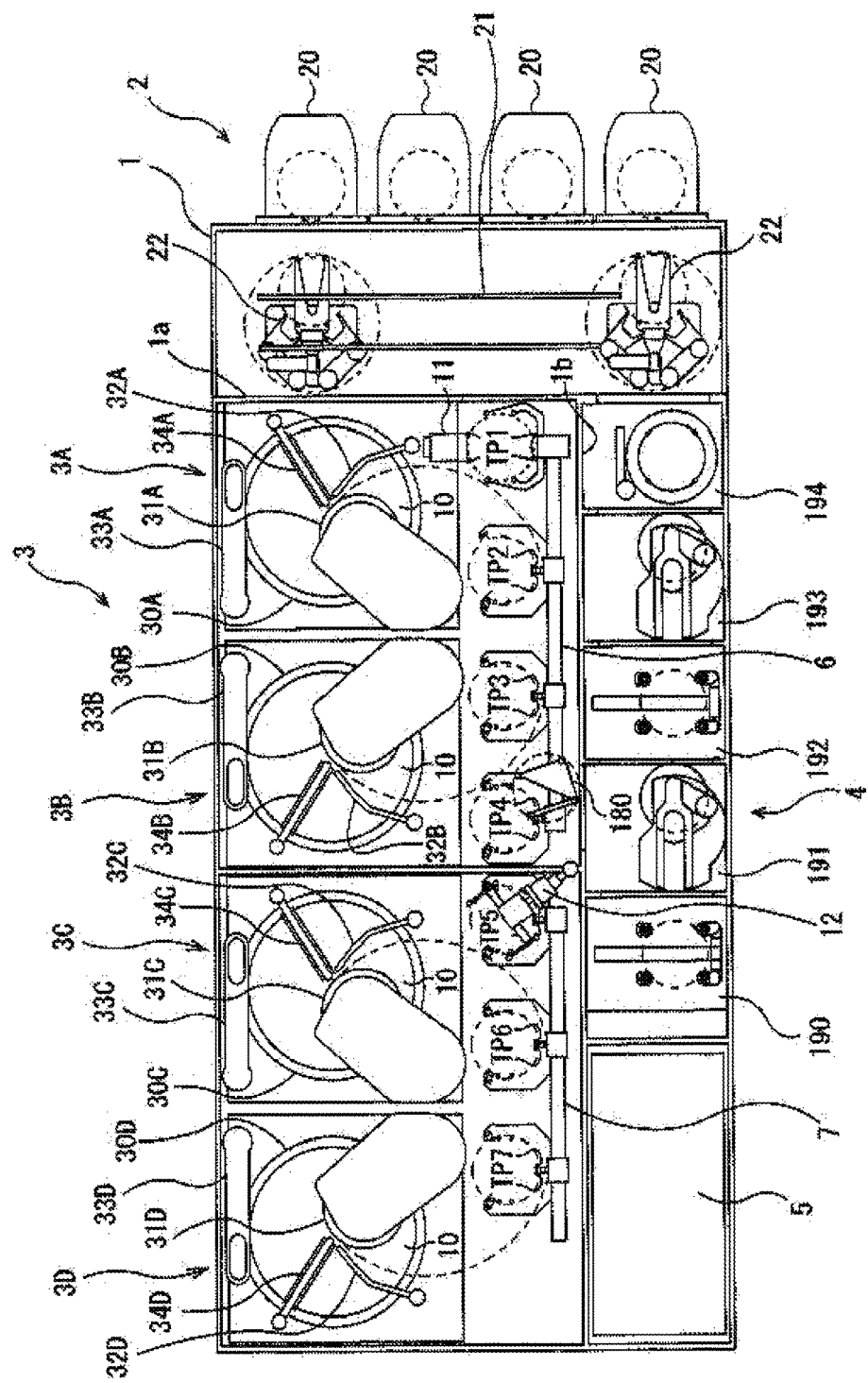
FIG. 1 is a plan view showing the entire configuration of a substrate processing apparatus according to an embodiment of the present technique.

A substrate processing apparatus according to an embodiment of the present technique will be described with reference to the drawings. The same or corresponding constituent elements are represented by same reference numerals, and duplicative descriptions thereof are omitted.

A substrate processing apparatus according to the present technique includes a transport mechanism for transporting a substrate along a predetermined transport passage while holding the substrate, a sensor for detecting whether the substrate is held by the transport mechanism, a sensor controller for controlling the sensor, a position information acquiring unit for acquiring position information of the substrate in the transport passage, a detection result acquiring unit for acquiring a detection result from the sensor, and a determining processor for determining whether the detection result of the sensor is consistent with the position information. When it is determined that the detection result of the sensor is inconsistent with the position information, the sensor controller makes the sensor retry to detect whether the substrate is held.

According to this configuration, whether the substrate is held by the transport mechanism is detected by the sensor. In addition, from the position information of the substrate in the transport passage, it is also estimated whether the substrate is held by the transport mechanism. It is determined whether the detection result of the sensor is consistent with the position information. When the detection result and the position information are inconsistent with each other, the sensor is made to retry the detection as to whether the substrate is held. When misdetection of the sensor is caused by chattering, the sensor would frequently return to a normally detectable state by sparing a little time. Accordingly, the influence of misdetection of the sensor caused by chattering can be reduced by making the sensor retry the detection as to whether the substrate is held when it is determined that the detection result of the sensor is inconsistent with the position information.

When a chattering detection time is set in consideration of a time (delay time) in which chattering has subsided, retardation corresponding to the delay time occurs every time the detection of the substrate is performed (for each substrate). For example, when three thousand substrates per day are processed, it takes the delay time corresponding to three thousand substrates for the processing even when no misdetection occurs on a day, resulting in decrease of the through-put. On the other hand, according to the present technique, only when it is determined that the detection result of the sensor is inconsistent with the position information, the sensor is made to retry the detection as to whether the substrate is held. If no misdetection occurs, the through-put does not decrease. Even when misdetection occurs, it takes only the time corresponding to the frequency of misdetection (for example, once per day at maximum), and thus decrease of the through-put can be suppressed as compared with the case where the delay time is set.

Furthermore, the substrate processing apparatus according to the present technique is provided with a storage unit for storing a retry frequency at which the sensor should be made to retry the detection. When a retried detection frequency exceeds the retry frequency, the sensor controller may make the sensor stop the processing of retrying the detection as to whether the substrate is held.

According to this configuration, when the retried detection frequency exceeds a predetermined retry frequency, the sensor controller makes the sensor stop the processing of retrying the detection as to whether the substrate is held. In the case of misdetection of the sensor caused by other factors than chattering, the sensor would rarely return to a normally detectable state even by sparing a little time. In such a case, occurrence of needless delay can be prevented by stopping the processing of making the sensor retry the detection as to whether the substrate is held.

Furthermore, the substrate processing apparatus of the present technique may be provided with an alarm processor for performing alarm processing to notify excess of the retry frequency when the retried detection frequency exceeds the retry frequency.

According to this configuration, when the retried detection frequency exceeds the predetermined retry frequency, alarm processing is executed to notify the excess of the retry frequency, whereby occurrence of misdetection of the sensor caused by other factors than chattering can be notified to an operator.

Furthermore, the substrate processing apparatus of the present technique may be provided with plural sensors. The determination processor may determine whether the detection result of each of the plural sensors is consistent with the position information, and the sensor controller may make the plural sensors retry the detection as to whether the substrate is held when it is determined that the detection result of at least one sensor of the plural sensors is inconsistent with the position information.

According to this configuration, it is detected by the plural sensors whether the substrate is held in the transport mechanism, and then it is determined whether each of the detection results of the plural sensors is consistent with the position information. When it is determined that the detection result of at least one sensor is inconsistent with the position information, the sensor is made to retry the detection as to whether the substrate is held. Accordingly, even in the case of occurrence of misdetection caused by chattering in some sensor out of the plural sensors, when the other sensors are in a normally detectable state, it can be properly determined based on the detection results of these normal sensors whether the detection result and the position information are consistent with each other.

In this case, when it is determined that all the detection results of the plural sensors are inconsistent with the position information (when misdetection caused by chattering occurs in all the sensors), the plural sensors are made to retry the detection as to whether the substrate is held. As described above, when the misdetection of the sensor is caused by chattering, the sensor would frequently return to a normally detectable state by sparing a little time. Accordingly, the influence of misdetection of the sensor caused by chattering can be reduced.

A substrate presence or absence checking method according to the present technique is a substrate presence or absence checking method to be executed in a substrate processing apparatus, the substrate processing apparatus including a transport mechanism for transporting a substrate along a predetermined transport passage while holding the substrate, and a sensor for detecting whether the substrate is held by the transport mechanism, and the substrate presence or absence checking method comprising a step of acquiring position information of the substrate in the transport passage, a step of acquiring a detection result from the sensor, a step of determining whether the detection result of the sensor is consistent with the position information, and a step of making the sensor retry to detect whether the substrate is held when it is determined that the detection result of the sensor and the position information are inconsistent with each other.

According to the foregoing substrate presence or absence checking method, it is also detected by the sensor whether the substrate is held by the transport mechanism as in the case of the substrate processing apparatus. In addition, it is estimated from the position information of the substrate in the transport passage whether the substrate is held by the transport mechanism. It is determined whether the detection result of the sensor is consistent with the position information, and when it is determined that the detection result of the sensor and the position information are inconsistent with each other, the sensor is made to retry the detection as to whether the substrate is held. When the misdetection of the sensor is caused by chattering, the sensor would frequently return to a normally detectable state by sparing a little time. Accordingly, the influence of the misdetection of the sensor caused by chattering can be suppressed by making the sensor retry to detect whether the substrate is held when it is determined that the detection result of the sensor and the position information are inconsistent with each other.

That is, when a chattering detection time is set in consideration of a time (delay time) in which chattering has subsided, retardation corresponding to the delay time occurs every time the detection of the substrate is performed (for each substrate). For example, when three thousand substrates per day are processed, it takes the delay time corresponding to three thousand substrates for the processing even when no misdetection occurs on a day, resulting in decrease of the through-put. On the other hand, according to the present technique, only when it is determined that the detection result of the sensor is inconsistent with the position information, the sensor is made to retry the detection as to whether the substrate is held. If no misdetection occurs, the through-put does not decrease. Even when misdetection occurs, it takes only the time corresponding to the frequency of misdetection (for example, once per day at maximum), and thus decrease of the through-put can be suppressed as compared with the case where the delay time is set.

A program of this technique is a program to be executed in a substrate processing apparatus, the substrate processing apparatus includes a transport mechanism for transporting a substrate along a predetermined transport passage while holding the substrate, and a sensor for detecting whether the substrate is held by the transport mechanism, and the program makes a substrate processing apparatus execute processing of acquiring position information of the substrate in the transport passage, processing of acquiring a detection result from the sensor, processing of determining whether the detection result of the sensor is consistent with the position information, and processing of making the sensor retry to detect whether the substrate is held when it is determined that the detection result of the sensor and the position information are inconsistent with each other.

According to the foregoing program, it is also detected by the sensor whether the substrate is held by the transport mechanism as in the case of the substrate processing apparatus. In addition, it is estimated from the position information of the substrate in the transport passage whether the substrate is held by the transport mechanism. It is determined whether the detection result of the sensor is consistent with the position information, and when it is determined that the detection result of the sensor and the position information are inconsistent with each other, the sensor is made to retry the detection as to whether the substrate is held. When the misdetection of the sensor is caused by chattering, the sensor would frequently return to a normally detectable state by sparing a little time. Accordingly, the influence of the misdetection of the sensor caused by chattering can be suppressed by making the sensor retry to detect whether the substrate is held when it is determined that the detection result of the sensor and the position information are inconsistent with each other.

That is, when a chattering detection time is set in consideration of a time (delay time) in which chattering has subsided, retardation corresponding to the delay time occurs every time the detection of the substrate is performed (for each substrate). For example, when three thousand substrates per day are processed, it takes the delay time corresponding to three thousand substrates for the processing even when no misdetection occurs on a day, resulting in decrease of the through-put. On the other hand, according to the present technique, only when it is determined that the detection result of the sensor is inconsistent with the position information, the sensor is made to retry the detection as to whether the substrate is held. If no misdetection occurs, the through-put does not decrease. Even when misdetection occurs, it takes only the time corresponding to the frequency of misdetection (for example, once per day at maximum), and thus decrease of the through-put can be suppressed as compared with the case where the delay time is set.

FIG. 1 is a plan view showing the entire configuration of a substrate processing apparatus according to an embodiment of the present technique. As shown in FIG. 1, the substrate processing apparatus has a substantially rectangular housing 1, and the inside of the housing 1 is compartmented into a load/unload section 2, a polishing section 3 and a cleaning section 4 by partition walls 1a, 1b. The load/unload section 2, the polishing section 3 and the cleaning section 4 are respectively independently assembled and independently evacuated. The substrate processing apparatus has a controller 5 for controlling a substrate processing operation.

The load/unload section 2 has two or more (four in this embodiment) front load portions 20 in which wafer cassettes for stocking many wafers (substrates) are mounted. These front load portions 20 are arranged to be adjacent to the housing 1, and aligned with one another along the width direction of the substrate processing apparatus (a direction vertical to the longitudinal direction). The front load portion 20 is configured so that an opening cassette, an SMIF (Standard Manufacturing Interface) pod or FOUP (Font Opening Unified Pod) can be installed in the front load portion 20. Here, each of SMIF and FOUP is a hermetically sealed container which is configured to house a wafer cassette therein and covered by a partition wall so as to be capable of maintaining an environment independent of an external space.

A traveling mechanism 21 is installed in the load/unload section 2 so as to be laid along the alignment of the front load portions 20, and two carry robots (loaders) 22 are installed on the traveling mechanism 21 so as to be movable along the arrangement direction of the wafer cassettes. The carry robots 22 are enabled to access the wafer cassettes mounted on the front load portions 20 by moving on the traveling mechanism 21. Each carry robot 22 has two hands arranged in the up-and-down direction, and the upper and lower hands can be selectively and properly used so that the upper hand is used to return a processed wafer to the wafer cassette while the lower hand is used to extract a pre-processing wafer from the wafer cassette. Furthermore, the lower hand of the carry robot 22 is configured to be rotatable around the axial center thereof so that a wafer can be reversed by rotation of the lower hand.

Since the load/unload section 2 is an area which is required to be kept under the cleanest state, the inside of the load/unload section 2 is kept to be higher in pressure than the outside of the substrate processing apparatus, the polishing section 3 and the cleaning section 4 at all times. The polishing section 3 is the most dirty area because slurry is used as polishing liquid in the polishing section 3. Accordingly, negative pressure is formed inside the polishing section 3, and the negative pressure is kept to be lower than the internal pressure of the cleaning section 4. The load/unload section 2 is provided with a filter fan unit (not shown) having a clean air filter such as an HEPA filter, a ULPA filter, a chemical filter or the like, and clean air from which particles, poisonous vapor and poisonous gas are removed is blown out from the filter fan unit at all times.

The polishing section 3 is an area in which a wafer is polished (planarized), and has a first polishing unit 3A, a second polishing unit 3B, a third polishing unit 3C and a fourth polishing unit 3D. The first polishing unit 3A, the second polishing unit 3B, the third polishing unit 3C and the fourth polishing unit 3D are aligned with one another in the longitudinal direction of the substrate processing apparatus as shown in FIG. 1.

As shown in FIG. 1, the first polishing unit 3A has a polishing table 30A to which a polishing pad 10 having a polishing face is fitted, a top ring 31A for holding a wafer and polishing the wafer while pressing the wafer against the polishing pad 10 on the polishing table 30A, a polishing liquid supply nozzle 32A for supplying polishing liquid and dressing liquid (for example, pure water) to the polishing pad 10, a dresser 33A for performing dressing on the polishing face of the polishing pad 10, and an atomizer 34A for atomizing mixture fluid of liquid (for example, pure water) and gas (for example, nitrogen gas) or liquid (for example, pure water) and spraying the atomized mixture fluid or the liquid to the polishing face.

Likewise, the second polishing unit 3B has a polishing table 30B to which the polishing pad 10 is fitted, a top ring 31B, a polishing liquid supply nozzle 32B, a dresser 33B and an atomizer 34B, the third polishing unit 3C has a polishing table 30C to which the polishing pad 10 is fitted, a top ring 31C, a polishing liquid supply nozzle 32C, a dresser 33C and an atomizer 34C, and the fourth polishing unit 3D has a polishing table 30D to which the polishing pad 10 is fitted, a top ring 31d, a polishing liquid supply nozzle 32D, a dresser 33D and an atomizer 34D.

Next, the structures of a first linear transporter 6, a second linear transporter 7, a lifter 11, a swing transporter 12 will be described.

Figure 2:
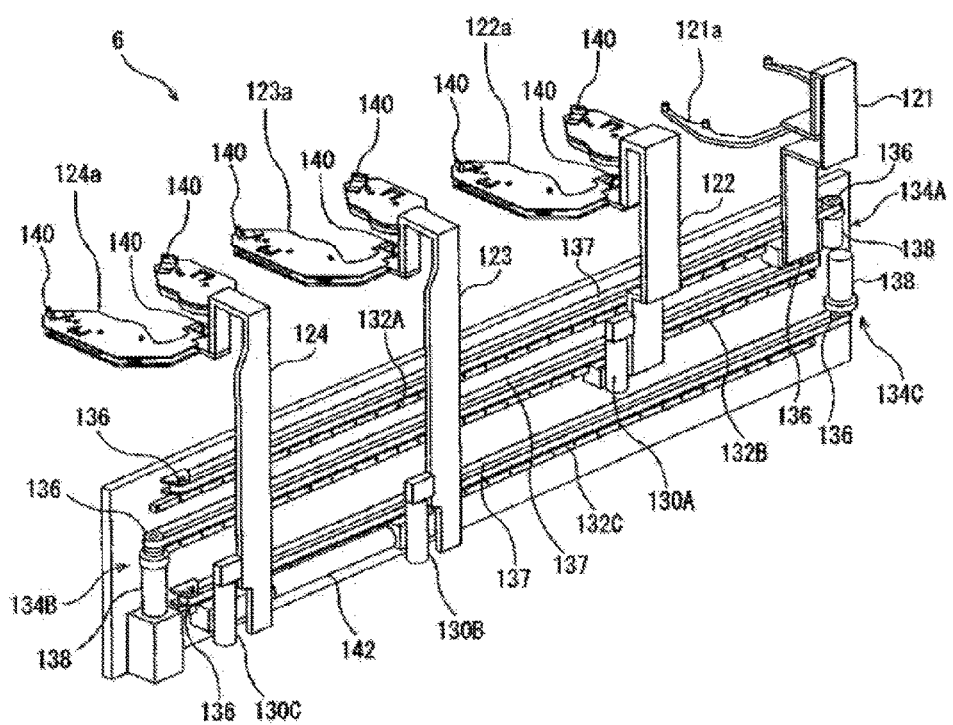
FIG. 2 is a perspective view which schematically shows a first linear transporter in the embodiment of the present technique.

FIG. 2 is a perspective view which schematically shows the first linear transporter 6. As shown in FIG. 2, the first linear transporter 6 includes first, second, third and fourth carry hands 121, 122, 123, 124 which have transport stages (substrate transport stages) 121a, 122a, 123a, 124a for mounting a wafer thereon respectively, three elevating mechanisms (for example, motor driving mechanism using ball screws or air cylinders) 130A, 130B and 130C for moving the second, third and fourth carry hands 122, 123 and 124 upwards and downwards respectively, three linear guides 132A, 132B and 132C for supporting the first, second, third and fourth carry hands 121, 122, 123 and 124 so that the first, second, third and fourth carry hands 121, 122, 123 and 124 are freely movable in a horizontal direction, and three horizontal driving mechanisms 134A, 134B and 134C for driving the first, second, third and fourth carry hands 121, 122, 123 and 124 in the horizontal direction. In this embodiment, each of the horizontal driving mechanisms 134A, 134B and 134C has a pair of pulleys 136, a belt 137 suspended between the pulleys 136 and a servo motor 138 for rotating any one of the pair of pulleys 136.

Plural pins are provided on the upper surface of each of the transport stages 121a, 122a, 123a and 124a, and a wafer is mounted on these pins. Each of the transport stages 121a, 122a, 123a and 124a is provided with a transmission type sensor 40 (for example, an optical sensor) for detecting the presence or absence of a wafer, thereby enabling detection of the presence or absence of a wafer on each of the transport stages 121a, 122a, 123a and 124a.

The first carry hand 121 is supported by the first linear guide 132A, and driven by the first horizontal driving mechanism 134A to move between a first transport position TP1 and a fourth transport position TP4. The first carry hand 121 is a pass hand for receiving a wafer from the lifter 11 and delivering the wafer to the second linear transporter 7. Accordingly, when a wafer is not polished in the first polishing unit 3A and the second polishing unit 3B, but polished in the third polishing unit 3C and the fourth polishing unit 3D, the first carry hand 121 is used. The first carry hand 121 is not provided with the elevating mechanism, and the transport stage (substrate pass stage) 121a of the first carry hand 121 is movable only in the horizontal direction.

The second carry hand 122 is supported by the second linear guide 132B, and driven by the second horizontal driving mechanism 134B to move between the first transport position TP1 and the second transport position TP2. The second carry hand 122 functions as an access hand for transporting a wafer from the lifter 11 to the first polishing unit 3a. That is, the second carry hand 122 moves to the first transport position TP1 and receives a wafer from the lifter 11 there. The second carry hand 122 moves to the second transport position TP2 again, and delivers the wafer on the transport stage 122a to the top ring 31A. A first elevating mechanism 130A is coupled to the second carry hand 122, and they move in the horizontal direction integrally with each other. When the wafer on the transport stage 122a is delivered to the top ring 31A, the second carry hand 122 is driven to move upwards by the first elevating mechanism 130A, delivers the wafer to the top ring 31A, and then is driven to move downwards by the first elevating mechanism 130A.

The upper surface of the transport stage 122a is provided with plural (three in the figures) access guides 140 to be fit to the lower end of the outer peripheral edge of the top ring 31A (the lower end of a retainer ring). The inside of the access guide 140 is configured to have a tapered surface. When the transport stage 122a moves upwards and accesses the top ring 31A, the top ring 31A is guided by these access guides 140 so that the top ring 31A and the transport stage 122a engage with each other. Through this engagement, the centering is performed between the top ring 31A and the transport stage 122a (that is, the wafer). The access guides 140 are likewise provided to the transport stages 123a, 124a of the third and fourth carry hands 123, 124.

The third carry hand 123 and the fourth carry hand 124 are supported by the third linear guide 132C. The third carry hand 123 and the fourth carry hand 124 are linked to each other through the air cylinder 142, and they are driven by the third horizontal driving mechanism 134C to move in the horizontal direction integrally with each other. The air cylinder 142 functions as an interval adjusting mechanism for adjusting the interval between the transport stage 123a of the third carry hand 123 and the transport stage 124a of the fourth carry hand 124. The air cylinder (interval adjusting mechanism) 142 is provided because there is a case where the interval between the first transport position TP1 and the second transport position TP2 is different from the interval between the second transport position TP2 and the third transport position TP3. The air cylinder 142 can perform an interval adjustment operation during movement of the third carry hand 123 and the fourth carry hand 124.

A second elevating mechanism 130B is coupled to the third carry hand 123, a third elevating mechanism 130C is coupled to the fourth carry hand 124, and the third carry hand 123 and the fourth carry hand 124 are movable upwards and downwards independently of each other. The third carry hand 123 moves among the first transport position TP1, the second transport position TP2 and the third transport position TP3, and at the same time the fourth carry hand 124 moves among the second transport position TP2, the third transport position TP3 and the fourth transport position TP4.

The third carry hand 123 functions as an access hand for transporting the wafer from the lifter 11 to the second polishing unit 3B. That is, the third carry hand 123 moves to the first transport position TP1, receives the wafer from the lifter 11 there, moves to the third transport position TP3 and then operates to deliver the wafer on the transport stage 123a to the top ring 31B. The third carry hand 123 also functions as an access hand for transporting the wafer polished in the first polishing unit 3A to the second polishing unit 3B. That is, the third carry hand 123 moves to the second transport position TP2, receives the wafer from the top ring 31A there, moves to the third transport position TP3 and then operates to deliver the wafer on the transport stage 123a to the top ring 31B. When the wafer is delivered between the transport stage 123a and the top ring 31A or the top ring 31B, the third carry hand 123 is driven to move upwards by the second elevating mechanism 130B, and after the delivery of the wafer is finished, the third carry hand 123 is driven to move downwards by the second elevating mechanism 130B.

The fourth carry hand 124 functions as an access hand for transporting a wafer polished in the first polishing unit 3A or the second polishing unit 3B to the swing transporter 12. That is, the fourth carry hand 124 moves to the second transport position TP2 or the third transport position TP3, receives the polished wafer from the top ring 31A or the top ring 31B and then moves to the fourth transport position TP4. When receiving the wafer from the top ring 31A or the top ring 31B, the fourth carry hand 124 is driven to move upwards by the third elevating mechanism 130C, receives the wafer and then driven to move downwards by the third elevating mechanism 130C.

Figure 3:
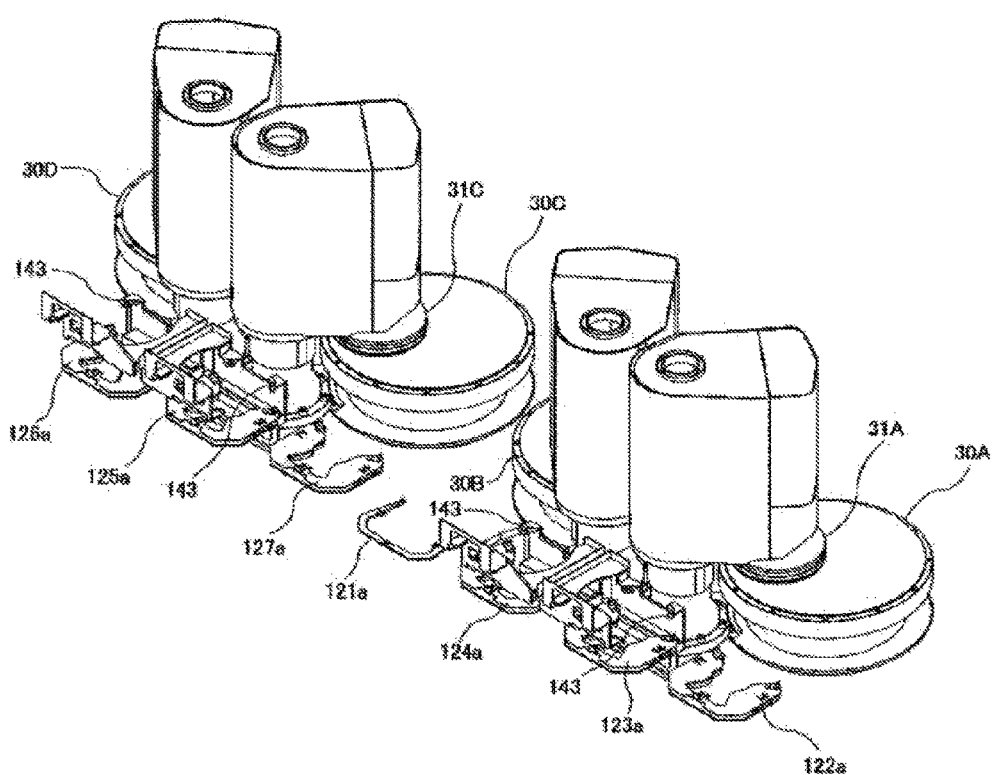
FIG. 3 is a perspective view showing transport stages, station units, polishing tables, and top rings in the embodiment of the present technique.
Figure 4:
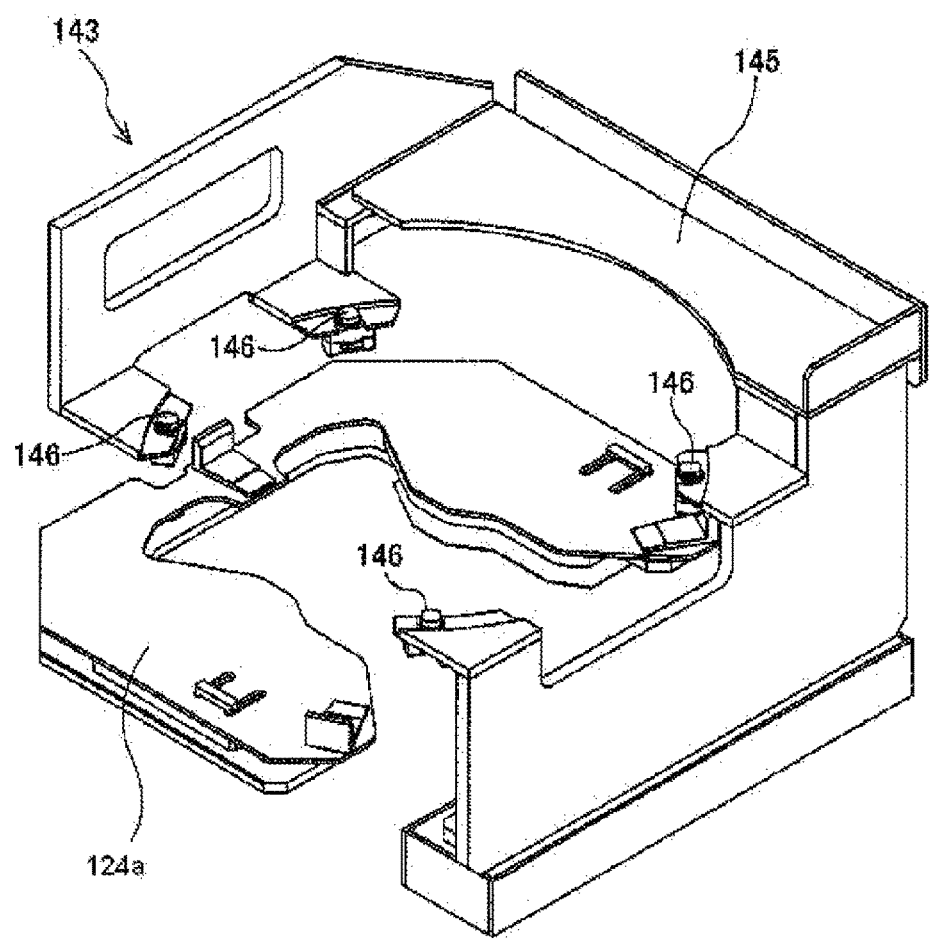
FIG. 4 is a perspective view showing the transport stage and the station unit in the embodiment of the present technique.

FIG. 3 is a perspective view showing the arrangement of the station units, the transport stages, the top rings which are provided at the second transport position TP2, the third transport position TP3, the sixth transport position TP6 and the seventh transport position TP7. FIG. 4 is a perspective view showing the station unit and the transport stage arranged at the second transport position TP2.

As shown in FIG. 3, the transport stages 121a to 127a are arranged on the transport passage between the station unit 143 and the top ring 31A, and transport a wafer W between the station unit 143 and the top ring 31A along the transport passage. As shown in FIG. 4, the station unit 143 has plural push-up mechanisms (not shown) for pushing up the retainer ring of the top ring 31A, and a support base 145 for supporting these push-up mechanisms. The push-up mechanism comprises a motor or the like, for example. The position in the height direction of the push-up mechanism is located between the top ring 31A and the transport stage (122a or 123a or 124a) of the first linear transporter 6. The push-up mechanism has push-up pins 146 which come into contact with the retainer ring. The push-up mechanism is arranged at a position where the push-up pins 146 face the lower surface of the retainer ring. When the top ring 31A moves downwards, the lower surface of the retainer ring comes into contact with the push-up pins 146. The retainer ring is pushed up by the push-up pins 146, and moved to a position above the wafer W.

Next, an operation executed when a wafer is delivered from the first linear transporter 5 to the top ring 31A will be described. First, the top ring 31A moves from a polishing position to the first transport position TP1. Subsequently, the top ring 31A moves downwards, and the retainer ring is pushed up by the push-up mechanism of the station unit 143 as described above. When the top ring 31A is moving downwards, the transport stage of the first linear transporter 5 moves upwards, and moves to a position just below the top ring 31A without coming into contact with the retainer ring. Under this state, the wafer W is delivered from the transport stage to the top ring 31A. The transport stage moves downwards substantially simultaneously with the upward movement of the top ring 31A. The top ring 31A further moves to the polishing position to polish the wafer W, and the transport stage starts a next carry operation. The same operation is performed when the wafer is delivered from the top ring 31A to the first linear transporter 5.

As described above, when the wafer is delivered, the top ring 31A and the transport stage approaches each other substantially at the same time and separates from each other substantially at the same time, so that the through-put can be enhanced. The configurations of the respective station units 143 installed at the third transport position TP3, the sixth transport position TP6 and the seventh transport position TP7 are the same as the station unit 143 described above, and the same wafer delivery operation is performed.

Figure 5:
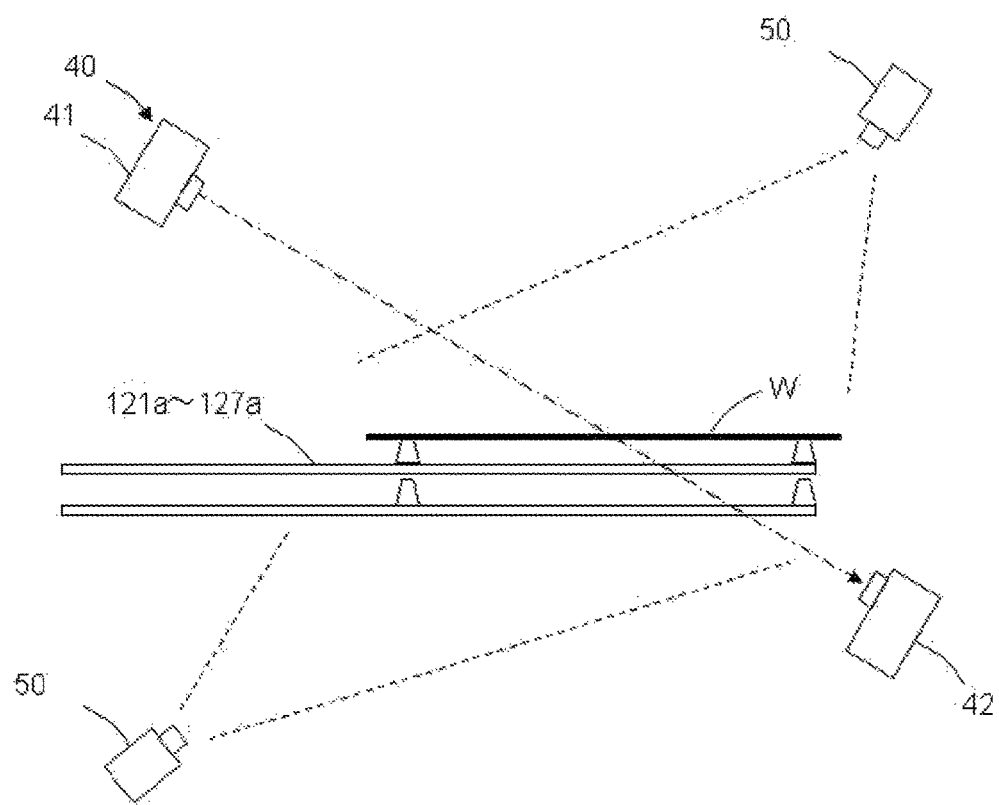
FIG. 5 is a diagram showing the positional relationship of the transport stage, a sensor and a shower nozzle in the embodiment of the present technique.

Next, the function possessed by the substrate processing apparatus (substrate presence or absence checking function) according to this embodiment will be described. FIG. 5 is a diagram showing the positional relationship of the transport stage, the sensor and the shower nozzle in this embodiment, and FIG. 6 is a block diagram showing the function (the substrate presence or absence checking function) of the substrate processing apparatus according to this embodiment.

As shown in FIG. 5, the transport passage in which the transport stages 121a to 127a transport the wafer W while holding the wafer W is provided with a sensor(s) 40 for detecting whether the wafer W is held in the transport stages 121a to 127a. The sensor 40 is, for example, an optical sensor, and comprises a light emitting portion 41 and a light receiving portion 42. In this embodiment, the number of the sensors 40 is set to one. When no wafer W is held in the transport stages 121a to 127a, light emitted from the light emitting portion 41 is directly (without being intercepted by the wafer w) received by the light receiving portion 42. On the other hand, when a wafer W is held in the transport stages 121a to 127a, light emitted from the light emitting portion 41 is intercepted by the wafer W, so that the amount of light received by the light receiving portion 42 is reduced. Based on the light amount received by the light receiving portion 42, the sensor 40 can detect whether the wafer W is held in the transport stages 121a to 127a.

As shown in FIG. 5, the transport passage is provided with a shower nozzle 50 for spraying water (pure water) to the wafer W so as to prevent the wafer W from being dried while the wafer W is transported by the transport stages 121a to 127a. For example, the shower nozzle 50 is arranged at each of both the sides of front and back surfaces of the wafer W.

Figure 6:
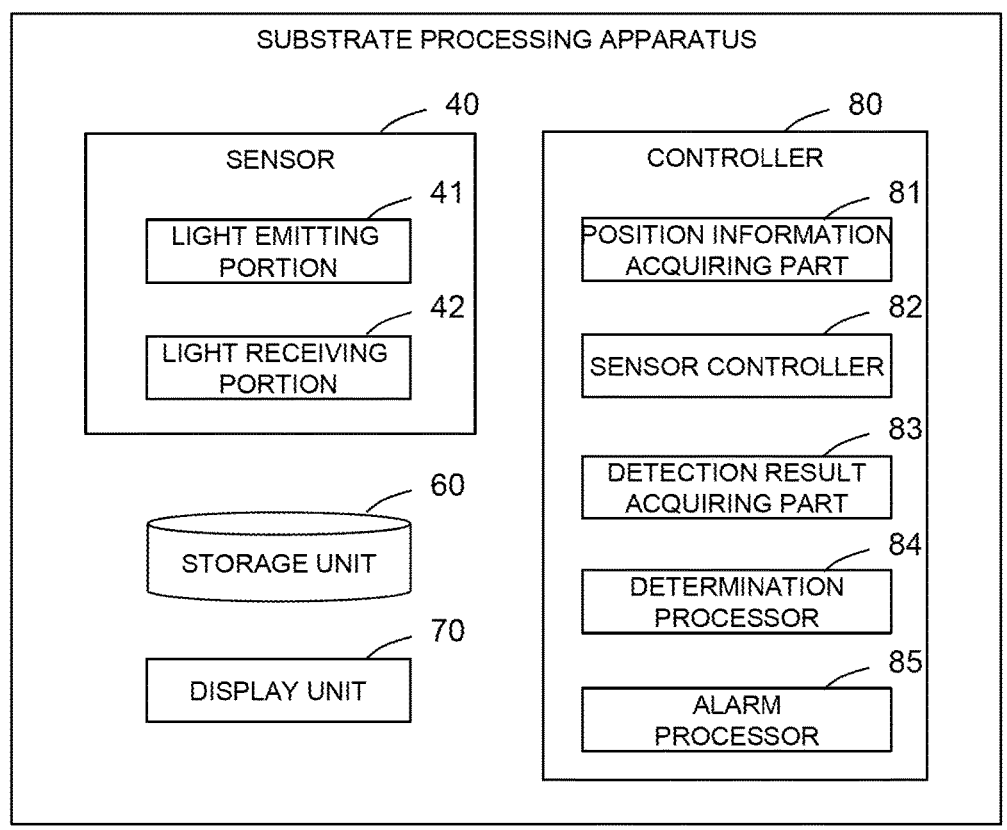
FIG. 6 is a block diagram showing the function (substrate presence or absence checking function) of the substrate processing apparatus according to the embodiment of the present technique.

As shown in FIG. 6, in addition to the sensor 40, the substrate processing apparatus has a storage unit 60, a display unit 70 and a controller 80 to establish a configuration for the substrate presence or absence checking function. The storage unit 60 comprises a memory or the like, for example, and the display unit 70 comprises a display or the like, for example. The controller 80 comprises CPU or the like, for example, and has a position information acquiring part 81, a sensor controller 82, a detection result acquiring part 83, a determination processor 84 and an alarm processor 85.

Position information of the wafer W in the transport passage is stored in the storage unit 60. The position information acquiring part 81 has a function of acquiring the position information of the wafer W in the transport passage from the storage unit 60. The sensor controller 82 has a function of controlling the sensor 40, and can control ON/OFF of the sensor 40, for example.

The detection result acquiring part 83 has a function of acquiring a detection result (a detection result indicating whether the wafer W is held in the transport stages 121a to 127a) from the sensor 40. The determination processor 84 has a function of determining whether the detection result of the sensor 40 acquired by the detection result acquiring part 83 is consistent with the position information acquired by the position information acquiring part 81. The determination processor 84 determines that the detection result of the sensor 40 and the position information are inconsistent with each other (determines that the detection as to the presence or absence of a wafer is abnormal) when the detection result of the sensor 40 indicates the absence of a wafer whereas the presence of a wafer should be determined by the sensor 40 according to the position information of the wafer W, or when the detection result of the sensor 40 indicates the presence of a wafer whereas the absence of a wafer should be determined by the sensor 40 according to the position information of the wafer W. On the other hand, the determination processor 84 determines that the detection result of the sensor and the position information are consistent with each other (determines that the detection of the presence or absence of a wafer is normal) when the detection result of the sensor 40 indicates the presence of a wafer when the presence of a wafer should be determined by the sensor 40 according to the position information of the wafer W, or when the detection result of the sensor 40 indicates the absence of a wafer when the absence of a wafer should be determined by the sensor according to the position information of the wafer W.

When it is determined that the detection result of the sensor 40 is inconsistent with the position information, the sensor controller 82 performs retry control for making the sensor 40 retry the detection as to whether the wafer W is held. This retry control is executed by a program stored in the memory or the like of the substrate processing apparatus. A time which the sensor 40 needs to retry the detection of the wafer W is equal to 0.3 seconds, for example.

A retry frequency at which the sensor 40 should be made to retry the detection is stored in the storage unit 60. The retry frequency may be arbitrarily set by an operator. The retry frequency is set to five times, for example. When the retry control frequency exceeds a set retry frequency, the sensor controller 82 stops the processing of making the sensor 40 retry to detect whether the wafer W is held. When the retry control frequency exceeds the set retry frequency, the alarm processor 85 performs alarm processing of notifying the excess of the retry frequency. When the alarm processing is performed, an alarm is issued to the operator by displaying an alarm on the screen of the display unit 70, for example. The issuance of the alarm is not limited to the display of an alarm on the display unit 70, but a publicly-known issuance method using sound or light may be used.

The operation of the thus-configured substrate processing apparatus will be described with reference to FIG. 7.

Figure 7:
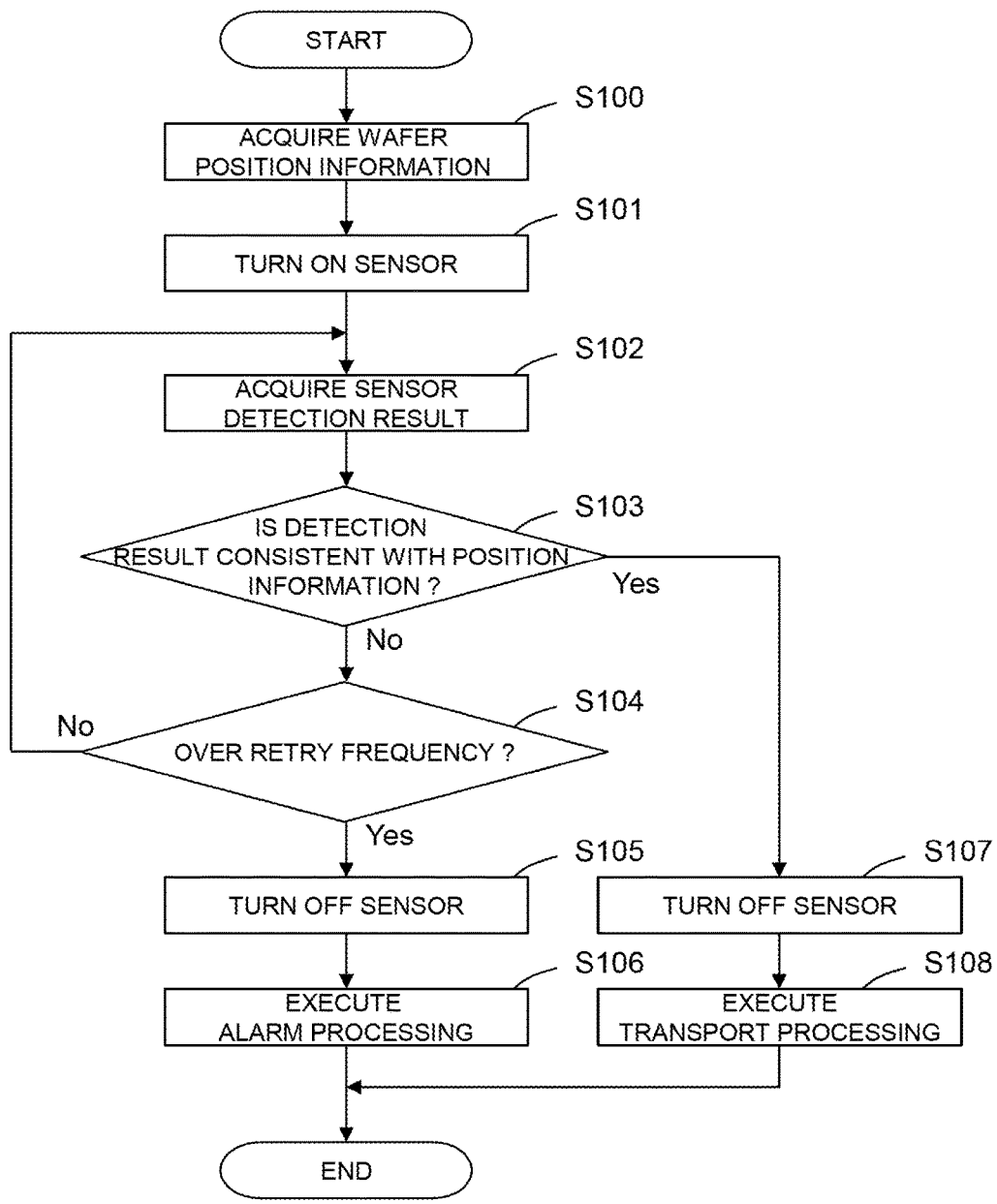
FIG. 7 is a flowchart showing the flow of the substrate presence or absence checking processing in the substrate processing apparatus according to the embodiment of the present technique.

FIG. 7 is a flowchart showing the flow of the substrate presence or absence checking processing in the substrate processing apparatus according to the embodiment. As shown in FIG. 7, when the substrate presence or absence checking processing is executed in the substrate processing apparatus, the position information of the wafer W in the transport passage is acquired from the storage unit 60 by the position information acquiring part 81 (S100). Subsequently, the sensor 40 is controlled to be turned on by the sensor controller 82, thereby starting light emission from the light emitting portion 41 (S101). Then, the detection result acquiring part 83 acquires the detection result (the detection result indicating whether the wafer W is held in the transport stages 121a to 127a) from the sensor 40 (S102).

Thereafter, it is determined by the determination processor 84 whether the detection result of the sensor 40 acquired by the detection result acquiring part 83 and the position information acquired by the position information acquiring part 81 are consistent with each other (S103). When the determination result of the step S103 indicates that the detection result of the sensor 40 and the position information are inconsistent with each other, it is determined whether the retried detection frequency exceeds the set retry frequency (S104).

When the determination result of the step S104 indicates that the retried detection frequency exceeds the retry frequency, the sensor controller 82 controls to turn off the sensor 40, the light emission from the light emitting portion 41 is stopped (S105), and the alarm processor 85 performs the alarm processing of notifying that the retried detection frequency exceeds the retry frequency (S106).

On the other hand, when the determination result of the step S104 indicates that the retried detection frequency does not exceed the retry frequency, the detection result acquiring part 83 acquires the detection result (the detection result indicating whether the wafer W is held in the transport stages 121*a* to 127*a*) from the sensor 40 again (S102), and it is determined whether the detection result (retried detection result) of the sensor 40 and the position information are consistent with each other (S103).

When the determination result of the step S103 indicates that the detection result of the sensor 40 and the position information are consistent with each other, the sensor controller 82 controls to turn off the sensor 40, thereby stopping the light emission from the light emitting portion 41 (S107), and the transport processing of the wafer W along the transport passage is executed (S108).

According to the substrate processing apparatus of this embodiment as described above, the influence of the misdetection of the sensor 40 caused by chattering can be reduced, whereby reduction of the through-put can be suppressed.

In this embodiment, it is detected by the sensor 40 whether the wafer W is held in the transport stages 121*a* to 127*a*. In addition, it is also estimated from the position information of the wafer W in the transport passage whether the wafer W is held in the transport stages 121*a* to 127*a*. It is determined whether the detection result of the sensor 40 and the position information are consistent with each other, and when the determination result indicates the inconsistency, the sensor 40 is made to retry the detection as to whether the wafer w is held. When the misdetection of the sensor 40 is caused by chattering, the sensor 40 would frequently return to the normal detectable state by sparing a little time. Accordingly, the influence of the misdetection of the sensor 40 caused by chattering can be reduced by making the sensor 40 retry to detect whether the wafer W is held when it is determined that the detection result of the sensor 40 is inconsistent with the position information as described above.

In a case where the detection time of chattering is set in consideration of a time (delay time) in which chattering has subsided, retardation corresponding to the delay time occurs every time the detection of the wafer W is performed (for each wafer). For example, when three thousand wafers W per day are processed, it takes the delay time corresponding to three thousand wafers for the processing even when no misdetection occurs on a day, resulting in decrease of the through-put. On the other hand, according to this embodiment, only when it is determined that the detection result of the sensor 40 is inconsistent with the position information, the sensor 40 is made to retry the detection as to whether the wafer is held. If no misdetection occurs, the through-put does not decrease. Even when misdetection occurs, it takes only the time corresponding to the occurrence frequency of misdetection (for example, once per day at maximum), and thus decrease of the through-put can be suppressed as compared with the case where the delay time is set.

Furthermore, in this embodiment, when the retried detection frequency exceeds the predetermined retry frequency, the processing of making the sensor 40 retry to detect whether the wafer W is held is stopped. In the case of misdetection of the sensor 40 caused by other factors than chattering, the sensor 40 would rarely return to a normally detectable state even by sparing a little time. In such a case, the processing of making the sensor 40 retry to detect whether the wafer W is held is stopped, thereby preventing occurrence of needless retardation.

Furthermore, in this embodiment, when the retried detection frequency exceeds a predetermined retry frequency, alarm processing of notifying the excess of the retry frequency is executed. Therefore, occurrence of misdetection of the sensor 40 caused by a factor other than chattering can be notified to an operator.

The exemplary embodiments of the present technique have been described above. However, the scope of the present technique is not limited to these embodiments, and may be changed and modified according to the purpose within the scope described in Claims.

For example, in the foregoing description, the example in which the substrate processing apparatus is equipped with one sensor 40. However, one transport stage (for example, the transport stage 124*a*) may be provided with plural sensors 40 (for example, two sensors 40) for detecting whether the wafer W is held. In this case, the determination processor determines whether the detection result of each of the plural sensors 40 is consistent with the position information, and the sensor controller 82 may make the plural sensors 40 retry to detect whether the wafer W is held when the detection result of at least one of the plural sensors 40 is inconsistent with the position information.

Figure 8:
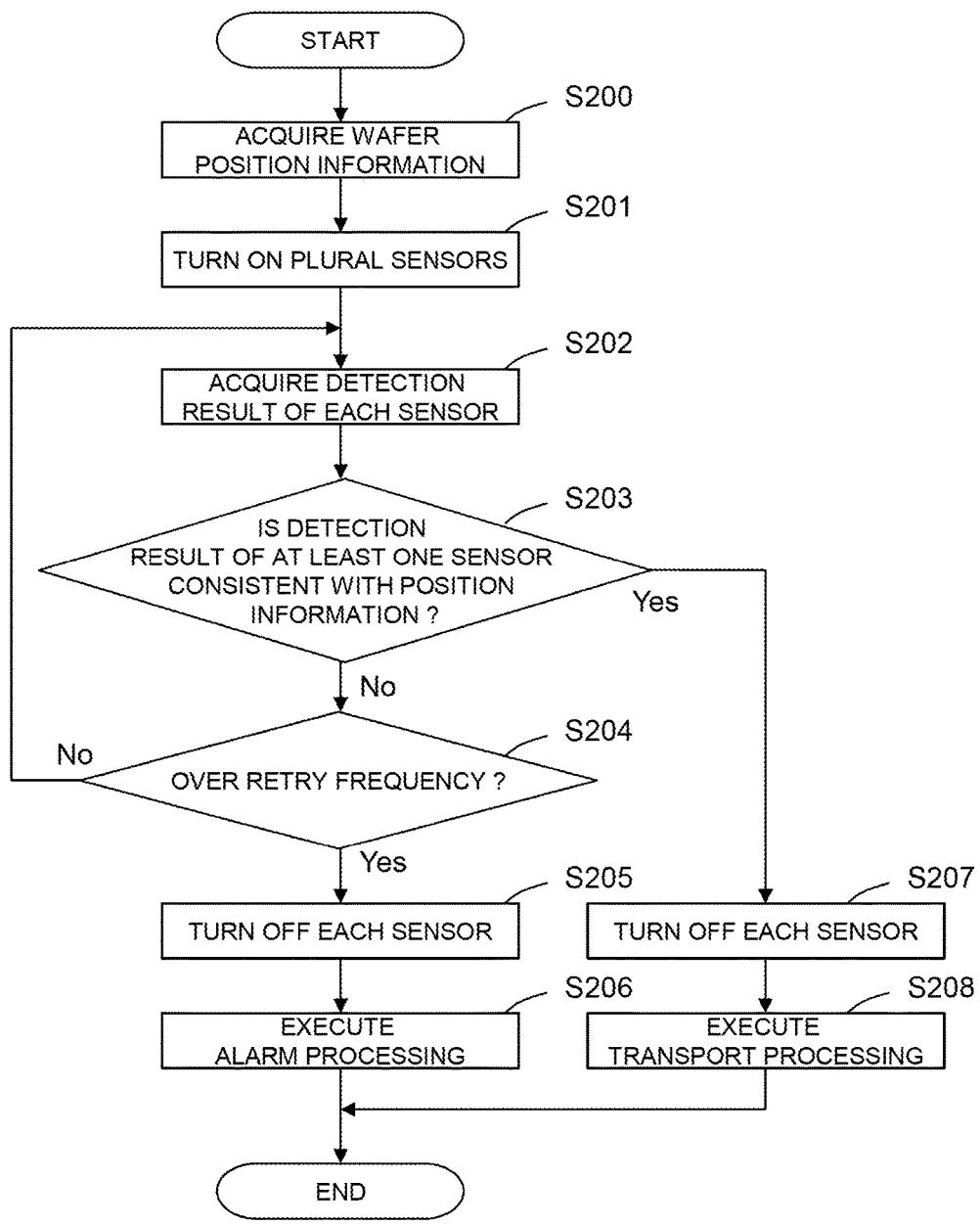
FIG. 8 is a flowchart showing the flow of the substrate presence or absence checking processing in the substrate processing apparatus according to another embodiment.

FIG. 8 is a flowchart showing the flow of the substrate presence or absence checking processing according to another embodiment as described above. In this case, as shown in FIG. 8, the position information of the wafer W in the transport passage is first acquired from the storage unit 60 by the position information acquiring part 81 (S200). Subsequently, the plural sensors 40 are controlled to be turned on by the sensor controller 82, and light emission from the light emitting portion 41 is started (S201). The detection result acquiring part 83 acquires detection results (for example, a detection result indicating whether the wafer W is held in some transport stage 124*a*) from the plural sensors 40 (S202).

Thereafter, the determination processor 84 determines whether each of the detection results of the plural sensors 40 acquired by the detection result acquiring part 83 is consistent with the position information acquired by the position information acquiring part 81 (S203). When the determination result of the step S203 indicates that the detection result of at least one sensor 40 out of the plural sensors 40 is inconsistent with the position information, it is determined whether the retried detection frequency exceeds the set retry frequency (S204).

When the determination result of the step S204 indicates that the retried detection frequency exceeds the retry frequency, the sensor controller 82 controls to turn off the plural sensors 40, thereby stopping light emission from the light emitting portion 41 (S205), and the alarm processing for notifying the excess of the retry frequency is executed by the alarm processor 85 (S206).

On the other hand, when the determination result of the step S204 indicates that the retried detection frequency does not exceed the retry frequency, the detection results (for example, a detection result indicating whether the wafer W is held in the transport stage 124*a*) from the plural sensors 40 are acquired again by the detection result acquiring part 83 (S202), and also it is determined whether each of the detection results (retried detection results) of the plural sensors 40 is consistent with the position information (S203).

When the determination result of the step S203 indicates that the detection result of at least one sensor 40 out of the plural sensors 40 is consistent with the position information, the sensor controller 82 controls to turn off the plural sensors 40, thereby stopping light emission from the light emitting portion 41 (S107), and the transport processing of the wafer W along the transport passage is executed (S108).

In the case of the other embodiment as described above, it is detected by the plural sensors 40 (for example, the two sensors 40) whether the wafer W is held in one transport stage (for example, the transport stage 124*a*). Then, it is determined whether each of the detection results of the plural sensors 40 and the position information are consistent with each other, and when it is determined that the detection result of at least one sensor 40 is inconsistent with the position information, the sensor 40 is made to retry the detection as to whether the wafer W is held. Accordingly, even in a case of occurrence of misdetection caused by chattering in some sensor 40, when the other sensors 40 are capable of performing normal detection, the consistency with the position information can be properly determined based on the detection results of the other normal sensors 40.

In this case, when it is determined that all the detection results of the plural sensors 40 are inconsistent with the position information (misdetection caused by chattering occurs in all the sensors 40), the plural sensors 40 are made to retry the detection as to whether the wafer W is held. When the misdetection of the sensor 40 is caused by chattering as described above, the sensor 40 would frequently return to a normally detectable state by sparing a little time. Accordingly, the influence of the misdetection of the sensor 40 caused by chattering can be reduced.

What is claimed is:

1. A substrate processing apparatus comprising:
a transport mechanism that transports a substrate along a predetermined transport passage while holding the substrate;
a sensor that detects whether the substrate is held by the transport mechanism;
a sensor controller that controls the sensor;
a position information acquiring part that acquires position information of the substrate in the transport passage;
a detection result acquiring part that acquires a detection result from the sensor; and
a determination processor that determines whether the detection result of the sensor is consistent with the position information, wherein when it is determined that the detection result of the sensor is inconsistent with the position information, the sensor controller makes the sensor retry to detect whether the substrate is held.

2. The substrate processing apparatus according to claim 1, further comprising a storage unit for storing a retry frequency at which the sensor should be made to retry detection, wherein when a retried detection frequency exceeds the retry frequency, the sensor controller stops processing of making the sensor retry the detection as to whether the substrate is held.

3. The substrate processing apparatus according to claim 2, further comprising an alarm processor for performing alarm processing to notify excess of the retry frequency when the retried detection frequency exceeds the retry frequency.

4. The substrate processing apparatus according to claim 1, further comprising a plurality of the sensors, wherein the determination processor determines whether a detection result of each of the plurality of the sensors is consistent with the position information, and when it is determined that the detection result of at least one of the plurality of the sensors is inconsistent with the position information, the sensor controller makes the plurality of the sensors retry to detect whether the substrate is held.

5. A substrate presence or absence checking method to be executed by a substrate processing apparatus that includes a transport mechanism for transporting a substrate along a predetermined transport passage while holding the substrate, and a sensor for detecting whether the substrate is held by the transport mechanism, comprising:
acquiring position information of the substrate in the transport passage;
acquiring a detection result from the sensor;
determining whether the detection result of the sensor is consistent with the position information; and
making the sensor retry to detect whether the substrate is held when it is determined that the detection result of the sensor is inconsistent with the position information.

6. A program to be executed by a substrate processing apparatus that includes a transport mechanism for transporting a substrate along a predetermined transport passage while holding the substrate, and a sensor for detecting whether the substrate is held by the transport mechanism, the program making the substrate processing apparatus execute:
processing of acquiring position information of the substrate in the transport passage;
processing of acquiring a detection result from the sensor;
processing of determining whether the detection result of the sensor is consistent with the position information; and
processing of making the sensor retry to detect whether the substrate is held when it is determined that the detection result of the sensor is inconsistent with the position information.

\* \* \* \* \*